(12) United States Patent
Yang

(10) Patent No.: US 8,891,329 B2
(45) Date of Patent: Nov. 18, 2014

(54) INPUT BUFFER

(71) Applicant: Samsung Electronics Co., Ltd., Suwon-si (KR)

(72) Inventor: Yunseok Yang, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 14 days.

(21) Appl. No.: 13/835,244

(22) Filed: Mar. 15, 2013

(65) Prior Publication Data

US 2013/0308408 A1 Nov. 21, 2013

(30) Foreign Application Priority Data

May 18, 2012 (KR) .................. 10-2012-0053269

(51) Int. Cl.
*G11C 7/22* (2006.01)
*H03K 19/003* (2006.01)
(52) U.S. Cl.
CPC .............. *H03K 19/00384* (2013.01)
USPC ..................... 365/226; 365/189.05
(58) Field of Classification Search
USPC ......................... 365/189.05, 226
See application file for complete search history.

(56) References Cited

U.S. PATENT DOCUMENTS

| | | | |
|---|---|---|---|
| 5,939,904 A | 8/1999 | Fetterman et al. | |
| 6,094,093 A * | 7/2000 | Karanicolas | 327/560 |
| 6,452,429 B1 | 9/2002 | Lim | |
| 6,504,404 B2 | 1/2003 | Uchiki et al. | |
| 6,870,423 B2 | 3/2005 | Takauchi et al. | |
| 7,098,699 B2 | 8/2006 | Tamura et al. | |
| 7,248,079 B2 | 7/2007 | Bhattacharya et al. | |
| 7,834,670 B2 | 11/2010 | Nakajima | |
| 7,898,899 B2 | 3/2011 | Kobayashi | |
| 2004/0100838 A1* | 5/2004 | Tamura et al. | 365/200 |
| 2005/0218945 A1* | 10/2005 | Kobayashi | 327/112 |
| 2008/0239845 A1* | 10/2008 | Na | 365/194 |
| 2011/0148464 A1 | 6/2011 | Hatakeyama et al. | |

FOREIGN PATENT DOCUMENTS

| | | |
|---|---|---|
| JP | 2010178094 | 8/2010 |
| KR | 10-1055788 | 8/2011 |

* cited by examiner

*Primary Examiner* — Michael Tran
(74) *Attorney, Agent, or Firm* — Ellsworth IP Group PLLC

(57) ABSTRACT

An input buffer includes a first buffer circuit to amplify a difference between a first input signal and a second input signal; a second buffer circuit formed of a replica circuit of the first buffer circuit to generate a common mode output signal in response to the first input signal; and a detector to compare the common mode output signal with a reference output signal and to control the first and second buffer circuits according to the comparison result such that a level of the common mode output signal coincides with a level of the reference output signal.

20 Claims, 7 Drawing Sheets

INPUT BUFFER

CROSS-REFERENCE TO RELATED APPLICATIONS

A claim for priority under 35 U.S.C. §119 is made to Korean Patent Application No. 10-2012-0053269 filed May 18, 2012, in the Korean Intellectual Property Office, the entire contents of which are hereby incorporated by reference.

BACKGROUND OF THE INVENTION

1. Field of the Invention

The present general inventive concepts described herein relate to an input buffer, and more particularly, relate to an input buffer capable of controlling a common mode output signal according to process, voltage, and temperature (hereinafter, referred to as PVT) variations.

2. Description of the Related Art

A semiconductor chip may be mounted on a printed circuit board (PCB) substrate, and may perform given logics and functions when it is supplied with an appropriate driving voltage. The semiconductor chip may be provided with an external signal to perform the given logics and functions. The external signal may be buffered through an input buffer of the semiconductor chip.

A conventional input buffer may be a static input buffer. The static input buffer may be formed of an inverter which includes PMOS and NMOS transistors connected in series between a power supply voltage and a ground voltage. The static buffer may have the merit of being simple in structure. However, since the static buffer is weak against a noise, it may be difficult to apply the static buffer to a semiconductor chip which necessitates an input signal having a small swing magnitude and a high operating frequency. For this reason, a differential amplifier type input buffer being tolerable against a noise may be applied to a semiconductor chip which necessitates an input signal having a small swing magnitude and a high operating frequency.

An output signal of the differential amplifier type input buffer may be formed of a differential mode output signal and a common mode output signal. The common mode output signal may be a component becoming a standard of the output signal of the input buffer, and may vary according to PVT variations. Thus, it is necessary to control a variation of the common mode output signal.

SUMMARY OF THE INVENTION

The present general inventive concept provides an input buffer comprising a first buffer circuit configured to amplify a difference between a first input signal and a second input signal; a second buffer circuit formed of a replica circuit of the first buffer circuit and configured to generate a common mode output signal in response to the first input signal; and a detector configured to compare the common mode output signal with a reference output signal and to control the first and second buffer circuits according to the comparison result such that a level of the common mode output signal coincides with a level of the reference output signal.

The detector may provide the second buffer circuit with one of an up control signal to increase a level of the common mode output signal and a down control signal to decrease a level of the common mode output signal.

The detector may provide the first buffer circuit with at least one of the up control signal and the down control signal when a level of the common mode output signal coincides with a level of the reference output signal.

The up and down control signals may be formed of a digital value.

The first buffer circuit may comprise a differential amplifier to amplify a difference between the first input signal and the second input signal, an inverter circuit to invert an output signal of the differential amplifier, a first bias circuit to generate a bias current in response to the up control signal and to provide the bias current to the inverter circuit, and a second bias circuit to generate a bias current in response to the down control signal and to provide the bias current to the inverter circuit.

A level of an output signal of the inverter circuit may vary according to the bias currents generated from the first and second bias circuits.

The first bias circuit may include a plurality of PMOS transistors such that the gates of the PMOS transistors are connected to receive digital values of the up control signal and the drains of the PMOS transistors may be interconnected.

At least one of the PMOS transistors may maintain a turn-on state.

The second bias circuit may include a plurality of NMOS transistors such that the gates of the NMOS transistors are connected to receive digital values of the down control signal and the drains of the NMOS transistors may be interconnected.

At least one of the NMOS transistors may maintain a turn-on state.

Additional features and utilities of the present general inventive concept will be set forth in part in the description which follows and, in part, will be obvious from the description, or may be learned by practice of the general inventive concept.

The foregoing and/or other features and utilities of the present general inventive concept may also be achieved by providing an input buffer comprising a buffer circuit to generate a common mode output signal in response to two input signals being equal; and a detector to compare the common mode output signal with a reference output signal and to control the buffer circuit according to the comparison result such that a level of the common mode output signal coincides with a level of the reference output signal. The buffer circuit includes at least one bias circuit supplying a bias current to an output terminal of the buffer circuit and the detector transfers a control signal to the at least one bias circuit to control a magnitude of the bias current.

The at least one bias circuit may include a plurality of PMOS transistors or a plurality of NMOS transistors such that gates of the PMOS or NMOS transistors may be connected to receive digital values of the control signal and the drains of the PMOS or NMOS transistors may be interconnected.

The control signal may include an up control signal to increase a level of the common mode output signal and a down control signal to decrease a level of the common mode output signal.

At least one of the PMOS transistors or at least one of the NMOS transistors may keep a turn-on state.

A semiconductor memory system may comprise an input buffer comprising a first buffer circuit to amplify a difference between a first input signal and a second input signal; a second buffer circuit formed of a replica circuit of the first buffer circuit to generate a common mode output signal in response to the first input signal; and a detector to compare the common mode output signal with a reference output signal and to control the first and second buffer circuits according to the comparison result such that a level of the common mode output signal coincides with a level of the reference output signal.

The foregoing and/or other features and utilities of the present general inventive concept may also be achieved by providing an input buffer to control a variation of a common mode output signal, the input buffer including a first buffer circuit operating in differential mode to generate a differential output signal; a second buffer circuit duplicating the first buffer circuit in configuration and operating in common mode to generate a common mode output signal; and a detector to compare the common mode output signal with a reference output signal, to control the second buffer circuit such that a level of the common mode output signal matches the reference output signal, and to control the first buffer circuit such that any variation of the common mode output signal is removed from the differential output signal.

The detector may provide the second buffer circuit with an up control signal when a level of the common mode output signal is lower than a level of the reference output signal, and the detector may provide the second buffer circuit with a down control signal when a level of the common mode output signal is higher than a level of the reference output signal.

The detector may provide the first buffer circuit with a control signal when a level of the common mode output signal matches a level of the reference output signal.

The input buffer may comprise a plurality of first buffer circuits.

The detector may simultaneous provide an up control signal and a down control signal to the second buffer circuit based on a result of the comparison.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
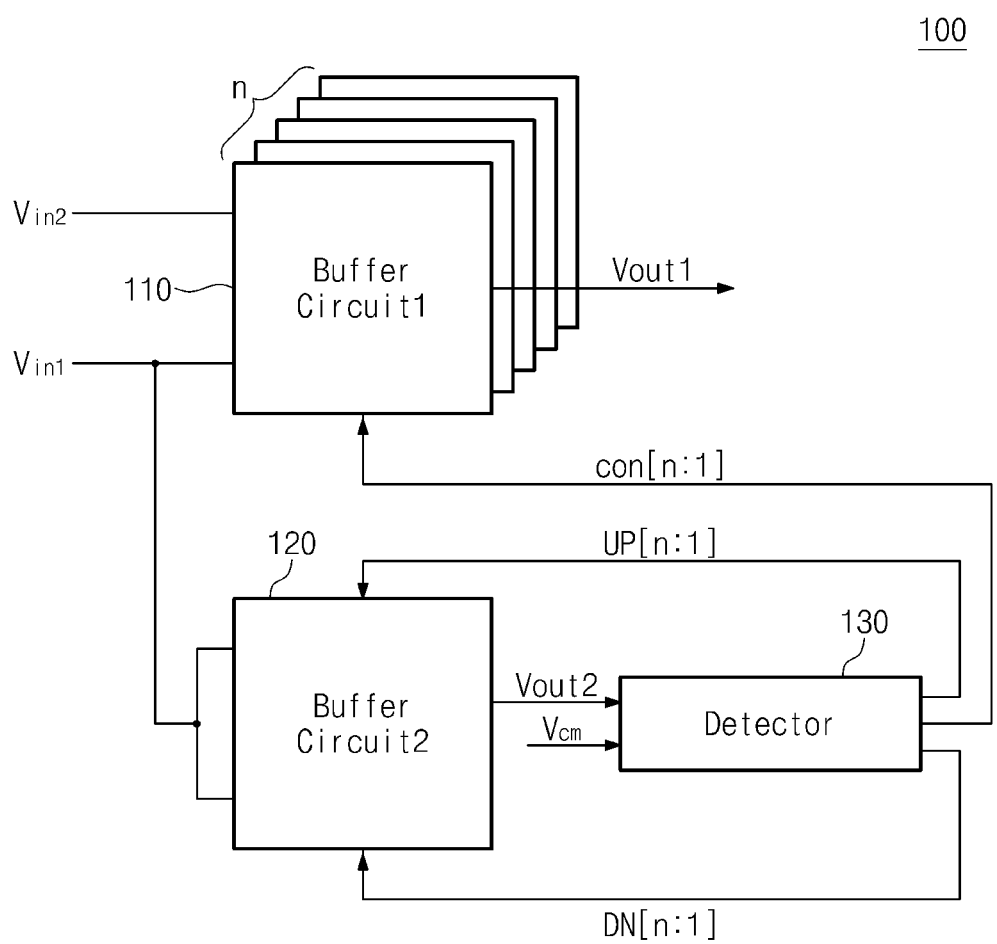
FIG. 1 is a block diagram schematically illustrating an input buffer according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

It will be understood that, although the terms "first", "second", "third", etc., may be used herein to describe various elements, components, regions, layers, and/or sections, these elements, components, regions, layers, and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present general inventive concept.

Spatially relative terms, such as "beneath", "below", "lower", "under", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below", or "beneath", or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the present general inventive concept. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating an input buffer according to an embodiment of the present general inventive concept.

Referring to FIG. 1, an input buffer 100 may include a first buffer circuit 110, a second buffer circuit 120, and a detector 130. The first buffer circuit 110 may be plural.

The first buffer circuit 110 may buffer a first input signal Vin1 and a second input signal Vin2 to generate an output signal Vout1. The first input signal Vin1 may be a reference signal having a constant voltage level.

The second buffer circuit 120 may be a replica circuit of the first input buffer 110. The second input buffer 120 may buffer the first input signal Vin1 to output an output signal Vout2. In detail, the second input buffer 120 may generate the output signal Vout2 by buffering the first input signal Vin1 received via two inputs. That is, it may be understood that the second buffer circuit 120 operates in a common mode. Ideally, the output signal Vout2 of the second buffer circuit 120 may be Vdd/2. However, the output signal Vout2 of the second buffer circuit 120 may vary due to process, voltage, and temperature (hereinafter, referred to as PVT) variations. This variation of the output signal Vout2 may be controlled by a feedback operation of the detector 130.

The detector 130 may compare the output signal Vout2 with a reference output signal Vcm, and may control the second buffer circuit 120 according to the comparison result. The reference output signal Vcm may be provided from an external device or from a voltage divider circuit using resistors and transistors. The reference output signal Vcm may be Vdd/2, for example.

When a level of the output signal Vout2 is lower than that of the reference output signal Vcm, the detector 130 may provide the second buffer circuit 120 with an up control signal UP[n:1]. Herein, the up control signal UP[n:1] may be used to increase a level of the output signal Vout2. When a level of the output signal Vout2 is higher than that of the reference output signal Vcm, the detector 130 may provide the second buffer circuit 120 with a down control signal DN[n:1]. Herein, the down control signal DN[n:1] may be used to lower a level of the output signal Vout2.

As described above, the output signal Vout2 of the second buffer circuit 120 may vary due to the PVT variations. The detector 130 may provide the up control signal UP[n:1] or the down control signal DN[n:1] to the second buffer circuit 120 through comparison between the output signal Vout2 and the reference output signal Vcm. This operation may be understood to be a feedback operation of the detector 130 where a level of the output signal Vout2 is controlled to coincide with a level of the reference output signal Vcm. With this control, a level of the output signal Vout2 may reach a level of the reference output signal Vcm. This may mean that a level variation in the output signal Vout2 of the second buffer circuit 120 due to the PVT variations is controlled.

When a level of the output signal Vout2 reaches a level of the reference output signal Vcm, the detector 130 may provide a control signal con[n:1] to the first buffer circuit 110. In a case where the first buffer circuit 110 is plural, the same control signal may be provided to the plurality of first buffer circuits 110. In detail, a level of a common mode output signal of the first buffer circuit 110 may reach a level of the reference output signal Vcm. Thus, the first buffer circuit 110 may generate the output signal Vout1 from which a variation in a common mode due to the PVT variations is removed.

Since the second buffer circuit 120 is a replica circuit of the first buffer circuit 110, the present general inventive concept will be described with reference to the second buffer circuit 120.

Figure 2:
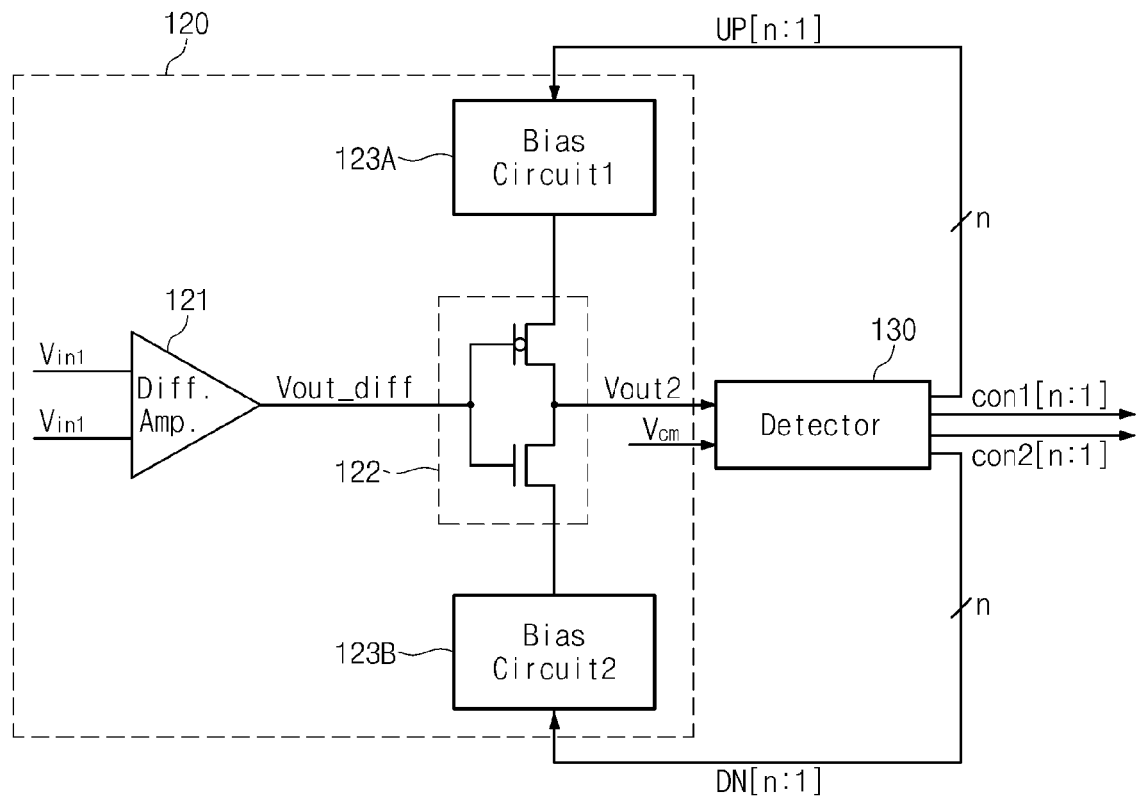
FIG. 2 is a block diagram schematically illustrating a second buffer circuit of FIG. 1.

FIG. 2 is a block diagram schematically illustrating a second buffer circuit of FIG. 1.

Referring to FIG. 2, a second buffer circuit 120 may include a differential amplifier 121, an inverter circuit 122, a first bias circuit 123A, and a second bias circuit 123B.

The differential amplifier 121 may generate an output signal Vout_diff in response to two first input signals Vin1. That is, the differential amplifier 121 may operate in a common mode. The first input signal Vin1 may be a reference signal having a constant voltage level. The inverter circuit 122 may invert the output signal Vout_diff of the differential amplifier 121.

The detector 130 may compare an output signal Vout2 of the inverter 122 with a reference output signal Vcm to provide a control signal to the first bias circuit 123A and/or the second bias circuit 123B. For example, when a level of the output signal Vout2 is lower than that of the reference output signal Vcm, the detector 130 may provide the first bias circuit 123A with an up control signal UP[n:1]. When a level of the output signal Vout2 is higher than that of the reference output signal Vcm, the detector 130 may provide the second bias circuit 123B with a down control signal DN[n:1].

The first bias circuit 123A and/or the second bias circuit 123B may supply a bias current to the inverter circuit 122 in response to a control signal from the detector 130. For example, the first bias circuit 123A may supply a bias current to the inverter circuit 122 in response to the up control signal UP[n:1] from the detector 130. The second bias circuit 123B may supply a bias current to the inverter circuit 122 in response to a down control signal DN[n:1] from the detector 130. The inverter circuit 122 may operate responsive to the bias current provided from the first bias circuit 123A and/or the second bias circuit 123B.

As described above, the output signal Vout2 of the inverter circuit 122 may vary due to PVT variations. The detector 130 may compare an output signal Vout2 of the inverter 122 with a reference output signal Vcm to provide an up control signal UP[n:1] or a down control signal DN[n:1] to the first bias circuit 123A or the second bias circuit 123B. As a result, a level of the output signal Vout2 of the second buffer circuit 120 may reach a level of the reference output signal Vcm under the control of the detector 130. This may mean that a level variation in the output signal Vout2 of the inverter circuit 120 due to the PVT variations is controlled. Also, the detector 130 may provide a first buffer circuit 110 with final control signals con1[n:1] and con2[n:1] obtained through the above-described feedback operation.

Figure 3:
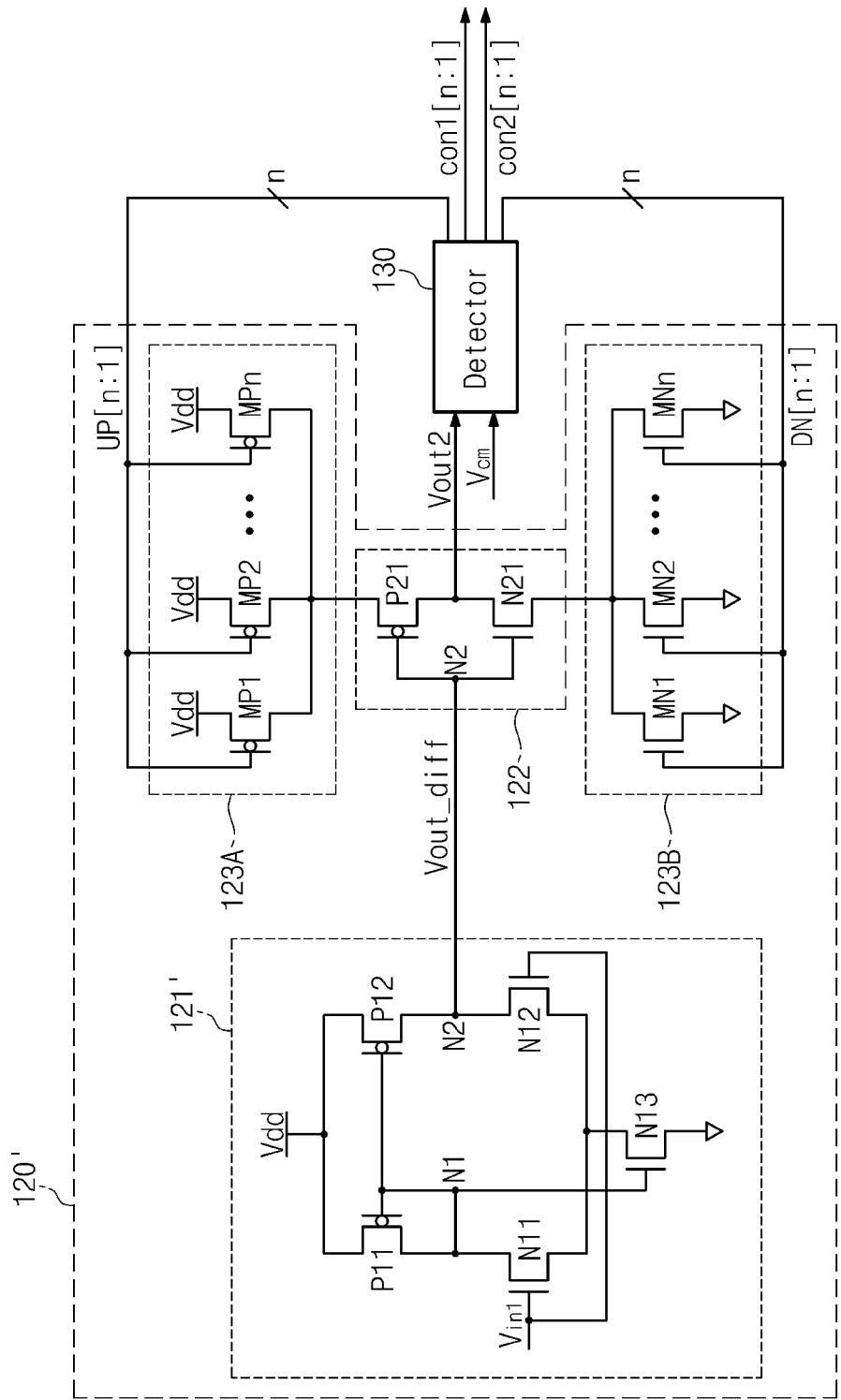
FIGS. 3 and 4 are circuit diagrams illustrating a second buffer circuit of FIG. 2.
Figure 4:
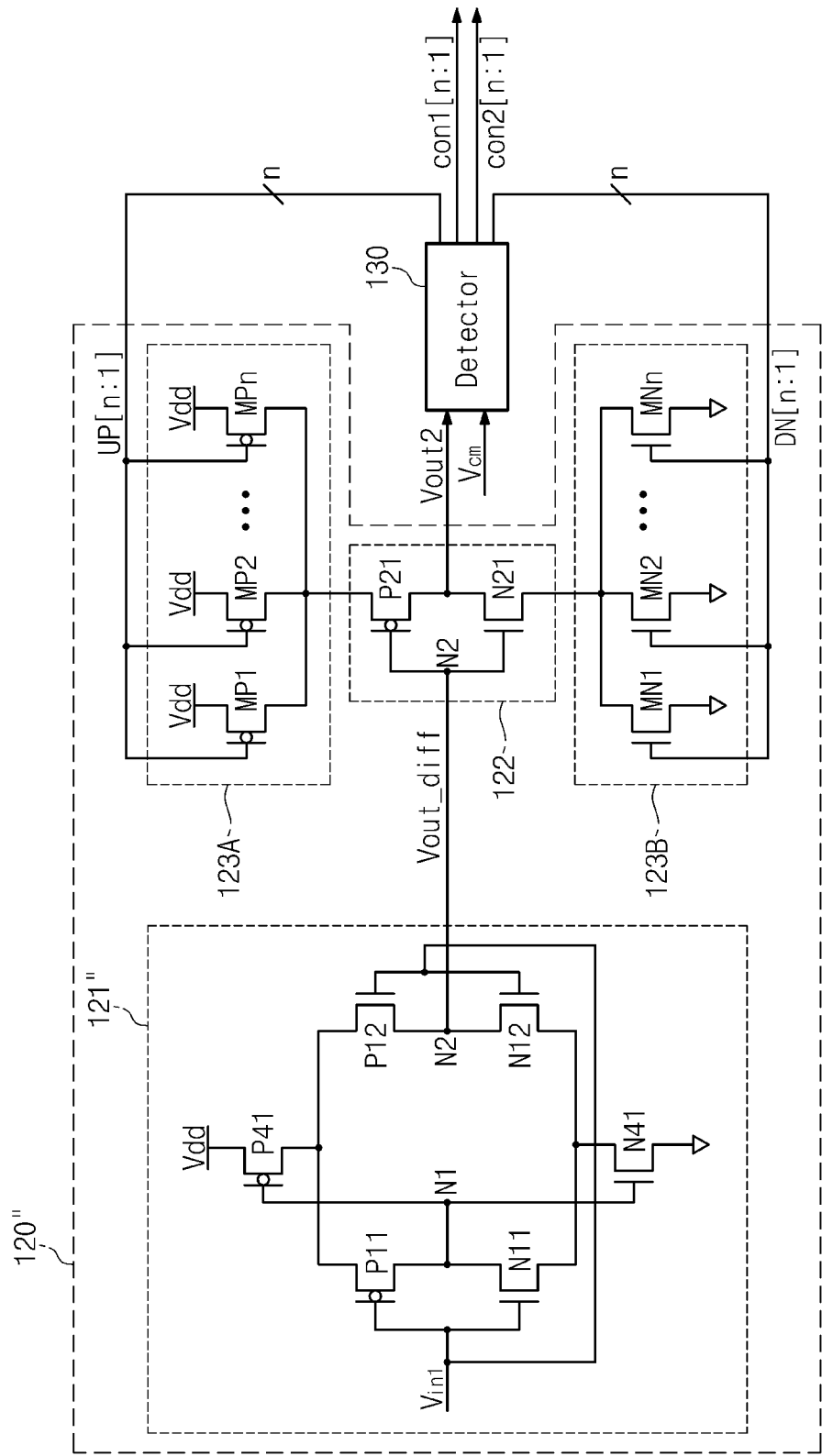

FIGS. 3 and 4 are circuit diagrams illustrating a second buffer circuit of FIG. 2.

Referring to FIG. 3, a second buffer circuit 120' may include a differential amplifier 121', an inverter circuit 122, a first bias circuit 123A, and a second bias circuit 123B.

The differential amplifier 121' may include first and second PMOS transistors P11 and P12 and first to third NMOS transistors N11 to N13.

The first and second PMOS transistors P11 and P12 may form a current mirror by connecting their sources with a power supply voltage Vdd and interconnecting their gates. The first NMOS transistor N11 may have a drain connected with a drain and a gate of the first PMOS transistor P11 and a gate connected to receive a first input signal Vin1. The second NMOS transistor N12 may have a drain connected with a drain of the second PMOS transistor P12 and a gate connected to receive the first input signal Vin1. The third NMOS transistor N13 may have a drain connected with sources of the first and second NMOS transistors N11 and N12, a gate connected with the gate and drain of the first PMOS P11 to receive a bias voltage, and a source grounded.

In FIG. 3, the gate of the third NMOS transistor N13 may be interconnected with the gates of the first and second PMOS transistors P11 and P12 to form a node N1. The drains of the transistors P12 and N12 may be interconnected to form a node N2. An output signal Vout_diff of the differential amplifier 121 may be output to the inverter circuit 122 via the node N2.

The inverter circuit 122 may include a third PMOS transistor P21 and a fourth NMOS transistor N21 which are connected in series between the first bias circuit 123A and the second bias circuit 123B. Gates of the transistors P21 and N21 may be connected to receive the output signal Vout_diff of the differential amplifier 121.

The first bias circuit 123A may include a plurality of PMOS transistors MP1 to MPn which are connected in parallel between a power supply voltage Vdd and the inverter circuit 122 (i.e., the source of the PMOS transistor P21) and are controlled by up control signals UP[n:1] from a detector 130. A part or all of the PMOS transistors MP1 to MPn may be turned on by the up control signals UP[n:1] from a detector 130. In example embodiments, at least one of the PMOS transistors MP1 to MPn may be turned on by the up control signals UP[n:1] from the detector 130.

The second bias circuit 123B may include a plurality of NMOS transistors MN1 to MNn which are connected in parallel between the inverter circuit 122 (i.e., the source of the NMOS transistor N21) and a ground voltage and are controlled by down control signals DN[n:1] from the detector 130. A part or all of the NMOS transistors MN1 to MNn may be turned on by the down control signals DN[n:1] from a detector 130. In example embodiments, at least one of the NMOS transistors MN1 to MNn may be turned on by the down control signals DN[n:1] from the detector 130.

Below, the second buffer circuit 120' and the detector 130 will be more fully described.

The differential amplifier 121' may generate the output signal Vout_diff in response to two first input signals Vin1. The first input signal Vin1 may be a reference signal having a constant voltage level. The inverter 122 may invert the output signal Vout_diff of the differential amplifier 121'. The detector 130 may compare an output signal Vout2 of the inverter circuit 122 with a reference output signal Vcm and provide a control signal to the first bias circuit 123A and/or the second bias circuit 123B based on the results of the comparison.

In a case where a level of the output signal Vout2 is lower than that of the reference output signal Vcm, the detector 130 may provide an up control signal UP[n:1] to the first bias circuit 123A. The up control signal UP[n:1] may have a digital value. In detail, in case that the detector 130 controls the first bias circuit 123A such that a level of the output signal Vout2 increases, the detector 130 may increase the number of '0' in the up control signal UP[n:1]. For example, the detector 130 may increase the number of '0' by changing a value of the up control signal UP[n:1] from '1110' to '1000'. The PMOS transistors MP1 to MPn in the first bias circuit 123A may be selectively turned on by the up control signal UP[n:1]. As the number of '0' in the up control signal UP[n:1] increases, the number of turned-on PMOS transistors may increase. This may mean that the amount of a bias current supplied to the inverter circuit 122 increases. That is, a level of the output signal Vout2 may increase. Note that at least one of PMOS transistors (e.g., MP1) in the first bias circuit 123A always keeps a turn-on state.

In a case where a level of the output signal Vout2 is lower than that of the reference output signal Vcm, the detector 130 may provide a down control signal DN[n:1] to the second bias circuit 123B. The down control signal DN[n:1] may have a digital value. In detail, in case that the detector 130 controls the second bias circuit 123B such that a level of the output signal Vout2 decreases, the detector 130 may increase the number of '0' in the down control signal DN[n:1]. For example, the detector 130 may increase the number of '0' by changing a value of the down control signal DN[n:1] from '1110' to '1000'. The NMOS transistors MN1 to MNn in the second bias circuit 123B may be selectively turned on by the down control signal DN[n:1]. As the number of '0' in the down control signal DN[n:1] increases, the number of turned-on NMOS transistors may decrease. This may mean that the amount of a bias current of the inverter circuit 122 decreases. That is, a level of the output signal Vout2 may increase. In this case, the down control signal DN[n:1] may be used to increase a level of the output signal Vout2. Note that at least one of NMOS transistors (e.g., MN1) in the second bias circuit 123B always keeps a turn-on state.

In a case where a level of the output signal Vout2 is higher than that of the reference output signal Vcm, the detector 130 may provide a down control signal DN[n:1] to the second bias circuit 123B. In detail, the detector 130 may increase the number of '1' in the down control signal DN[n:1]. For example, the detector 130 may increase the number of '1' by changing a value of the down control signal DN[n:1] from '1000' to '1110'. The NMOS transistors MN1 to MNn in the second bias circuit 123B may be selectively turned on by the down control signal DN[n:1]. As the number of '1' in the down control signal DN[n:1] increases, the number of turned-on NMOS transistors may increase. This may mean that the amount of current flowing to a ground from the inverter circuit 122 increases. That is, a level of the output signal Vout2 may decrease. Note that at least one of NMOS transistors (e.g., MN1) in the second bias circuit 123B always keeps a turn-on state.

In a case where a level of the output signal Vout2 is higher than that of the reference output signal Vcm, the detector 130 may provide an up control signal UP[n:1] to the first bias circuit 123A. In detail, the detector 130 may increase the number of '1' in the up control signal UP[n:1]. For example, the detector 130 may increase the number of '1' by changing a value of the up control signal UP[n:1] from '1000' to '1110'. The PMOS transistors MP1 to MPn in the first bias circuit 123A may be selectively turned on by the up control signal UP[n:1]. As the number of '1' in the up control signal UP[n:1] increases, the number of turned-on PMOS transistors may decrease. This may mean that the amount of a bias current supplied to the inverter circuit 122 decreases. That is, a level of the output signal Vout2 may decrease. In this case, the up control signal UP[n:1] may be used to decrease a level of the output signal Vout2. Note that at least one of PMOS transistors (e.g., MP1) in the first bias circuit 123A always keeps a turn-on state.

Further, the detector 130 may compare the output signal Vout2 with the reference output signal Vcm to provide the up control signal UP[n:1] and the down control signal DN[n:1] to the first bias circuit 123A and the second bias circuit 123B at the same time.

As described above, the output signal Vout2 of the inverter circuit 122 may vary due to PVT variations. The detector 130 may compare an output signal Vout2 of the inverter 122 with a reference output signal Vcm to provide an up control signal UP[n:1] or a down control signal DN[n:1] to the first bias circuit 123A or the second bias circuit 123B. As a result, a level of the output signal Vout2 of the second buffer circuit 120' may reach a level of the reference output signal Vcm under the control of the detector 130. This may mean that a level variation in the output signal Vout2 of the inverter circuit 120 due to the PVT variations is controlled. Also, the detector 130 may provide a first buffer circuit 110 with final control signals con1[n:1] and con2[n:1] obtained through the above-described feedback operation.

A second buffer circuit 120" in FIG. 4 may be identical to that in FIG. 3 except for a differential amplifier 121". In FIG. 4, constituent elements that are identical to those in FIG. 3 may be marked by the same reference numerals, and description thereof is thus omitted.

Referring to FIG. 4, a differential amplifier 121" may be a BAZES type differential amplifier, for example. In detail, the differential amplifier 122" may include first, second, and third PMOS transistors P11, P12, and P41 and first, second, and third NMOS transistors N11, N12, and N41. The PMOS transistor P41 may have a source connected with a power supply voltage Vdd, a gate, and a drain. The NMOS transistor N41 may have a source grounded, a gate, and a drain. The PMOS and NMOS transistors P11 and N11 may be connected in series between the drain of the PMOS transistor P41 and the drain of the NMOS transistor N41, and may be connected to receive an input signal Vin1 in common. The PMOS and NMOS transistors P12 and N12 may be connected in series between the drain of the PMOS transistor P41 and the drain of the NMOS transistor N41, and may be connected to receive an input signal Vin1 in common. The gates of the PMOS and NMOS transistors P41 and N41 may be connected with a common drain node of the PMOS and NMOS transistors P11 and N11. A bias voltage generated according to a self-biasing manner may be provided to the gates of the transistors P41 and N41.

Figure 5:
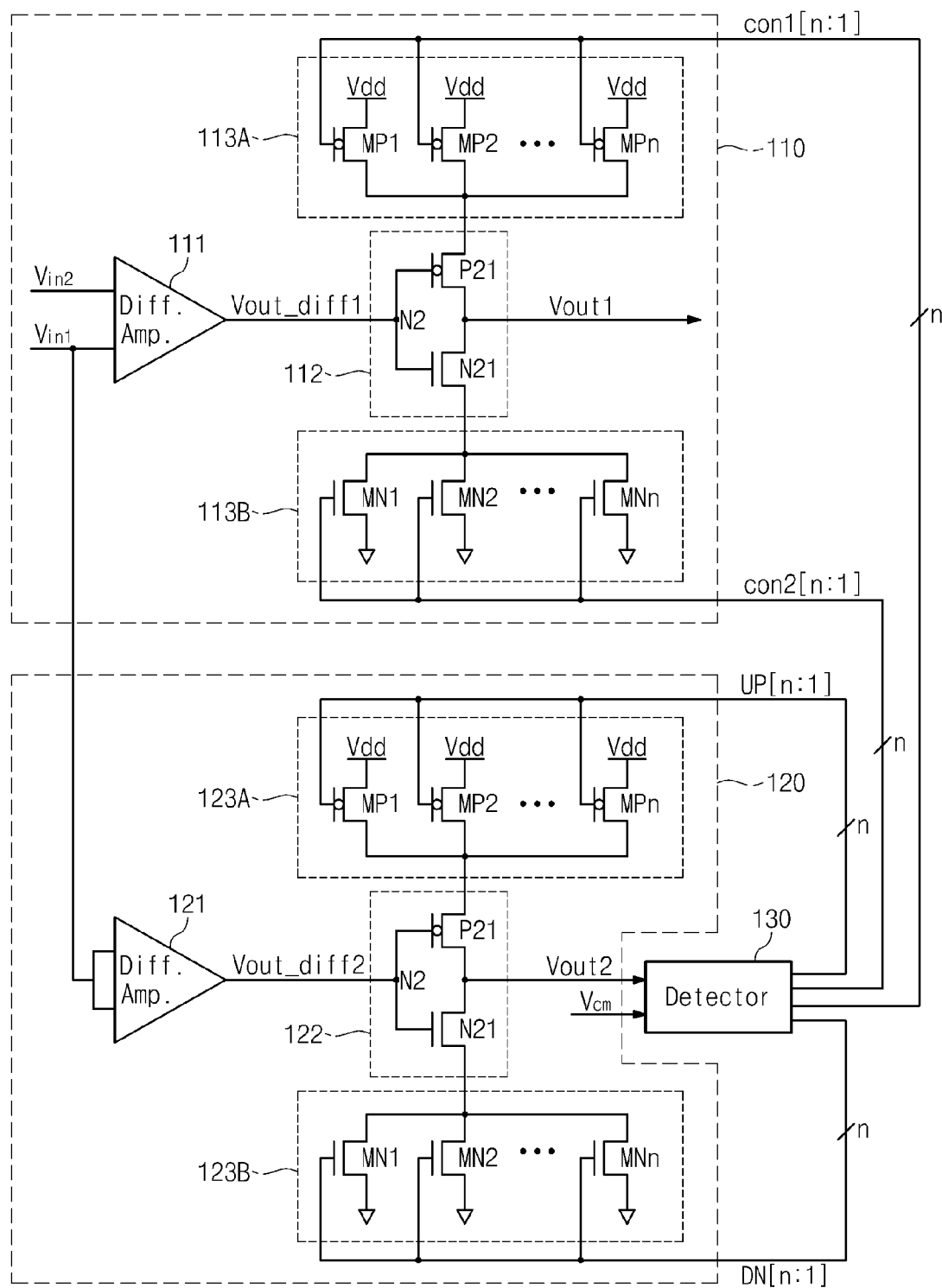
FIG. 5 is a circuit diagram illustrating an input buffer according to an embodiment of the present general inventive concept.

FIG. 5 is a circuit diagram illustrating an input buffer according to an embodiment of the inventive concepts. The same reference numerals may mean the same component, and description thereof is thus omitted.

Referring to FIG. 5, an input buffer 100 may include a first buffer circuit 110, a second buffer circuit 120, and a detector 130.

The first buffer circuit 110 may buffer a first input signal Vin1 and a second input signal Vin2 to generate an output signal Vout1. The first input signal Vin1 may be a reference signal having a constant voltage level. The first buffer circuit 110 may be configured the same as described with reference to FIGS. 2 to 4. The first buffer circuit 110 may be different from the second input buffer 120 in that the output signal Vout1 is generated through comparison of the first and second input signals Vin1 and Vin2.

The second buffer circuit 120 may be a replica circuit of the first buffer circuit 110. The second buffer circuit 120 may be configured the same as described with reference to FIGS. 2 to 4, and description thereof is thus omitted. Below, an overall operation of the input buffer 100 will be described.

The differential amplifier 121 of the second buffer circuit 120 may generate the output signal Vout_diff2 in response to two first input signals Vin1. The differential amplifier 111 of the first buffer circuit 110 may generate the output signal Vout_diff1 in response to a first input signal Vin1 and a second input signal Vin2. The first input signal Vin1 may be a reference signal having a constant voltage level. The inverter 122 of the second buffer circuit 120 may invert the output signal Vout_diff2 of the differential amplifier 121. The inverter 112 of the first buffer circuit 110 may invert the output signal Vout_diff1 of the differential amplifier 111. The detector 130 may compare an output signal Vout2 of the inverter circuit 122 with a reference output signal Vcm to provide a control signal to the first bias circuit 123A and/or the second bias circuit 123B.

In a case where a level of the output signal Vout2 is lower than that of the reference output signal Vcm, the detector 130 may provide an up control signal UP[n:1] to the first bias circuit 123A. The up control signal UP[n:1] may have a digital value. In detail, in case that the detector 130 controls the first bias circuit 123A such that a level of the output signal Vout2 increases, the detector 130 may increase the number of '0' in the up control signal UP[n:1]. The PMOS transistors MP1 to MPn in the first bias circuit 123A may be selectively turned on by the up control signal UP[n:1]. As the amount of a bias current supplied to the inverter circuit 122 increases, a level of the output signal Vout2 may increase. Note that at least one of PMOS transistors (e.g., MP1) in the first bias circuit 123A always keeps a turn-on state.

In a case where a level of the output signal Vout2 is lower than that of the reference output signal Vcm, the detector 130 may provide a down control signal DN[n:1] to the second bias circuit 123B. The down control signal DN[n:1] may have a digital value. In detail, in case that the detector 130 controls the second bias circuit 123B such that a level of the output signal Vout2 decreases, the detector 130 may increase the number of '0' in the down control signal DN[n:1]. The NMOS transistors MN1 to MNn in the second bias circuit 123B may be selectively turned on by the down control signal DN[n:1]. As the amount of a bias current of the inverter circuit 122 decreases, a level of the output signal Vout2 may increase. Note that at least one of NMOS transistors (e.g., MN1) in the second bias circuit 123B always keeps a turn-on state.

In a case where a level of the output signal Vout2 is higher than that of the reference output signal Vcm, the detector 130 may provide a down control signal DN[n:1] to the second bias circuit 123B. In detail, the detector 130 may increase the number of '1' in the down control signal DN[n:1]. The NMOS transistors MN1 to MNn in the second bias circuit 123B may be selectively turned on by the down control signal DN[n:1]. As the amount of current flowing to a ground from the inverter circuit 122 increases, a level of the output signal Vout2 may decrease. Note that at least one of NMOS transistors (e.g., MN1) in the second bias circuit 123B always keeps a turn-on state.

In a case where a level of the output signal Vout2 is higher than that of the reference output signal Vcm, the detector 130 may provide an up control signal UP[n:1] to the first bias circuit 123A. In detail, the detector 130 may increase the number of '1' in the up control signal UP[n:1]. The PMOS transistors MP1 to MPn in the first bias circuit 123A may be selectively turned on by the up control signal UP[n:1]. As the amount of a bias current supplied to the inverter circuit 122 decreases, a level of the output signal Vout2 may decrease. Note that at least one of PMOS transistors (e.g., MP1) in the first bias circuit 123A always keeps a turn-on state.

Further, the detector 130 may compare the output signal Vout2 with the reference output signal Vcm to provide the up control signal UP[n:1] and the down control signal DN[n:1] to the first bias circuit 123A and the second bias circuit 123B at the same time.

As described above, the output signal Vout2 of the inverter circuit 122 may vary due to PVT variations. The detector 130 may compare an output signal Vout2 of the inverter 122 with a reference output signal Vcm to provide an up control signal UP[n:1] or a down control signal DN[n:1] to the first bias circuit 123A or the second bias circuit 123B. As a result, a level of the output signal Vout2 of the second buffer circuit 120 may reach a level of the reference output signal Vcm under the control of the detector 130. This may mean that a level variation in the output signal Vout2 of the inverter circuit 122 due to the PVT variations is controlled.

The detector 130 may provide a first buffer circuit 110 with final control signals con1[n:1] and con2[n:1] obtained through the above-described feedback operation. The final control signal con1[n:1] may be the up control signal UP[n:1] and the final control signal con2[n:1] may be the down control signal DN[n:1]. In detail, the detector 130 may provide the first bias circuit 113A in the first buffer circuit 110 with the final control signal con1[n:1]. The detector 130 may provide the second bias circuit 113B in the first buffer circuit 110 with the final control signal con2[n:1].

The first bias circuit 113A of the first buffer circuit 110 may operate the same as the first bias circuit 123A of the second buffer circuit 120. A plurality of PMOS transistors MP1 to MPn in the first bias circuit 113A may be selectively turned on/off by the final control signal con1[n:1]. Also, the second bias circuit 113B of the first buffer circuit 110 may operate the same as the second bias circuit 123B of the second buffer circuit 120. A plurality of NMOS transistors MN1 to MNn in the first bias circuit 113A may be selectively turned on/off by the final control signal con2[n:1].

As a result, a level of a common mode output signal may be also controlled by the final control signal con1[n:1] and con2[n:1] generated by the second buffer circuit 120 and the detector 130. In detail, a common mode level of the first buffer circuit 110 may reach a level of the reference output signal Vcm. Thus, the first buffer circuit 110 may generate the output signal Vout1 from which a variation in the common mode level due to PVT variations is removed.

Figure 6:
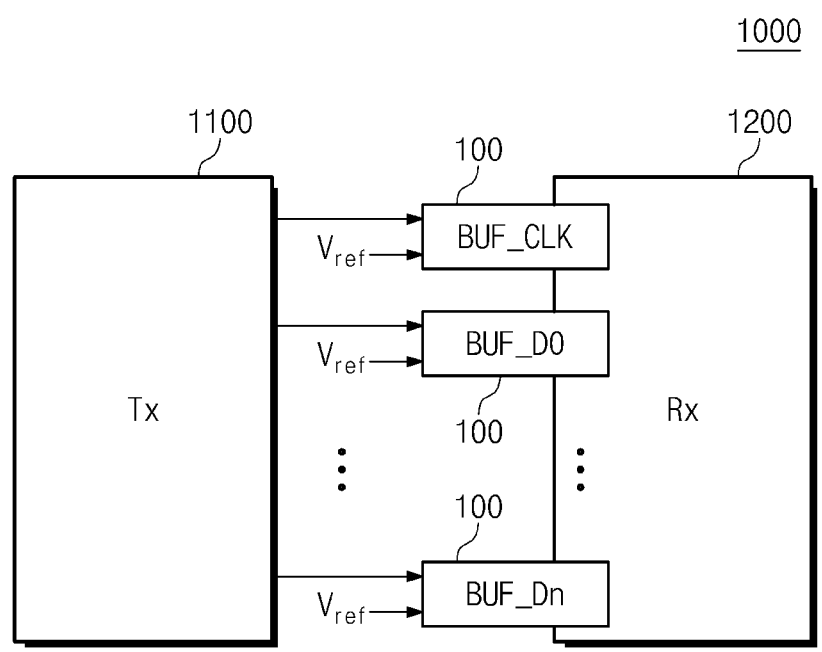
FIG. 6 is a block diagram schematically illustrating a semiconductor memory system according to an embodiment of the present general inventive concept.

FIG. 6 is a block diagram schematically illustrating a semiconductor memory system according to an embodiment of the present general inventive concept.

Referring to FIG. 6, a semiconductor memory system 1000 may include a transmitter 1100 and a receiver 1200. The receiver 1200 may be a semiconductor memory device such as a DRAM, a flash memory, or the like. The transmitter 1100 may be a controller controlling the semiconductor memory device. However, the present general inventive concept is not limited thereto.

The transmitter 1100 may transfer a clock signal CLK and data D0 to Dn to the receiver 1200. Input buffers 100 may store the data D0 to Dn in response to the clock signal CLK to output it to the receiver 1200. That is, the receiver 1200 may use the input buffers 100 as a buffer receiving the clock signal CLK and the data D0 to Dn. That is, each of the clock signal CLK and the data D0 to Dn may correspond to a second input signal $V_{in2}$ provided to the input buffer 100.

As described with reference to FIGS. 1 to 5, the input buffer 100 according to an embodiment of the inventive concepts may control a variation in a common mode output signal due to PVT variations. Thus, the reliability of the semiconductor memory system 1000 may be improved.

In example embodiments, each or all of a buffer circuit 100, a semiconductor memory device (e.g., a receiver 1200), and a semiconductor memory system 1000 may be packed by one selected from various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 7:
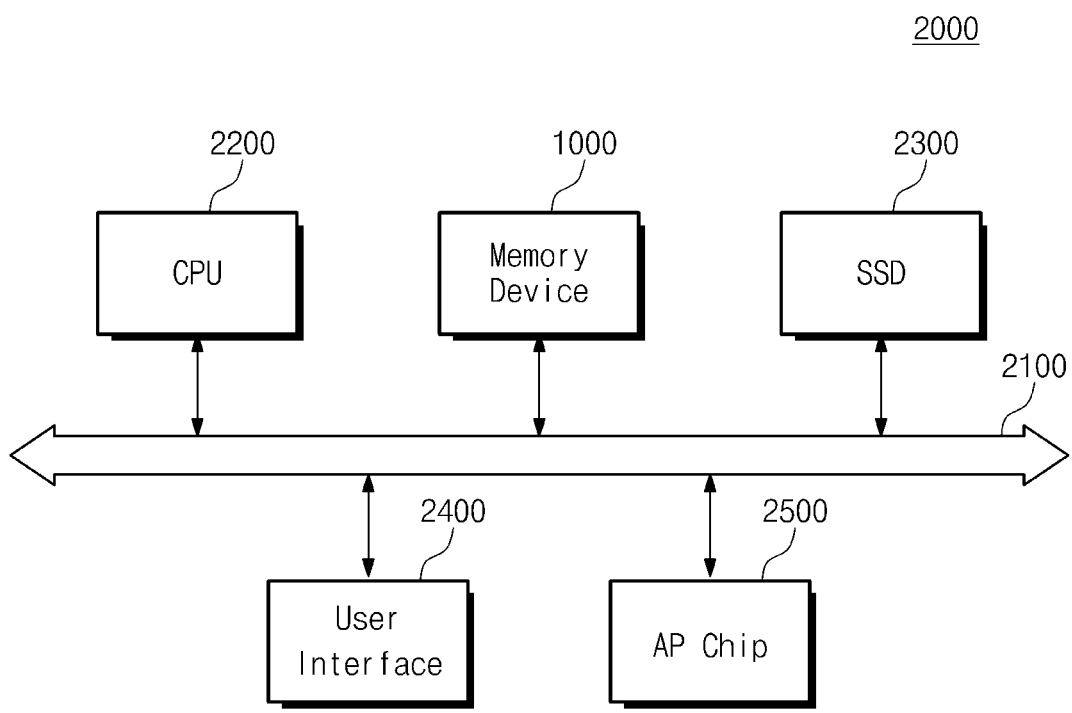
FIG. 7 is a block diagram schematically illustrating an electronic device according to an embodiment of the present general inventive concept.

FIG. 7 is a block diagram schematically illustrating an electronic device according to an embodiment of the present general inventive concept.

Referring to FIG. 7, an electronic device 2000 may include a CPU 2200, a memory device 1000, a solid state drive (SSD) 2300, a user interface 2400, and an application chipset 2500.

The electronic device 2000 may be a computing system such as a notebook computer, a PC, or the like or a mobile device such as a cellular phone, a PDA, a digital camera, a portable game console, an MP3 player, or the like. However, the present general inventive concept is not limited thereto.

The electronic device 2000 may use a semiconductor memory system described in FIG. 6 as a memory device for temporarily storing data for an operation of the electronic device 2000.

As described above, it is possible to realize a stable operating characteristic of the electronic device 2000 including a semiconductor memory system 1000 with the improved reliability.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An input buffer comprising:
   a first buffer circuit to amplify a difference between a first input signal and a second input signal;
   a second buffer circuit formed of a replica circuit of the first buffer circuit to generate a common mode output signal in response to the first input signal; and
   a detector to compare the common mode output signal with a reference output signal and to control the first and second buffer circuits according to the comparison result such that a level of the common mode output signal coincides with a level of the reference output signal.

2. The input buffer of claim 1, wherein the detector provides the second buffer circuit with one of an up control signal to increase a level of the common mode output signal and a down control signal to decrease a level of the common mode output signal.

3. The input buffer of claim 2, wherein the detector provides the first buffer circuit with at least one of the up control signal and the down control signal when a level of the common mode output signal coincides with a level of the reference output signal.

4. The input buffer of claim 3, wherein the up and down control signals are formed of a digital value.

5. The input buffer of claim 3, wherein the first buffer circuit comprises:
   a differential amplifier to amplify a difference between the first input signal and the second input signal;
   an inverter circuit to invert an output signal of the differential amplifier;
   a first bias circuit to generate a bias current in response to the up control signal and to provide the bias current to the inverter circuit; and
   a second bias circuit to generate a bias current in response to the down control signal and to provide the bias current to the inverter circuit.

6. The input buffer of claim 5, wherein a level of an output signal of the inverter circuit varies according to the bias currents generated from the first and second bias circuits.

7. The input buffer of claim 5, wherein the first bias circuit includes a plurality of PMOS transistors, gates of the PMOS transistors connected to receive digital values of the up control signal and drains of the PMOS transistors being interconnected.

8. The input buffer of claim 7, wherein at least one of the PMOS transistors maintains a turn-on state.

9. The input buffer of claim 5, wherein the second bias circuit includes a plurality of NMOS transistors, gates of the NMOS transistors being connected to receive digital values of the down control signal and drains of the NMOS transistors being interconnected.

10. The input buffer of claim 9, wherein at least one of the NMOS transistors keeps a turn-on state.

11. An input buffer comprising:
a buffer circuit to generate a common mode output signal in response to two input signals being equal; and
a detector to compare the common mode output signal with a reference output signal and to control the buffer circuit according to the comparison result such that a level of the common mode output signal coincides with a level of the reference output signal,
wherein the buffer circuit includes at least one bias circuit supplying a bias current to an output terminal of the buffer circuit and the detector transfers a control signal to the at least one bias circuit to control a magnitude of the bias current.

12. The input buffer of claim 11, wherein the at least one bias circuit includes a plurality of PMOS transistors or a plurality of NMOS transistors, gates of the PMOS or NMOS transistors being connected to receive digital values of the control signal and drains of the PMOS or NMOS transistors being interconnected.

13. The input buffer of claim 12, wherein the control signal includes an up control signal to increase a level of the common mode output signal and a down control signal to decrease a level of the common mode output signal.

14. The input buffer of claim 12, wherein at least one of the PMOS transistors or at least one of the NMOS transistors keeps a turn-on state.

15. A semiconductor memory system comprising an input buffer claimed in claim 1.

16. An input buffer to control a variation of a common mode output signal, the input buffer comprising:
a first buffer circuit operating in differential mode to generate a differential output signal;
a second buffer circuit duplicating the first buffer circuit in configuration and operating in common mode to generate a common mode output signal; and
a detector to compare the common mode output signal with a reference output signal, to control the second buffer circuit such that a level of the common mode output signal matches the reference output signal, and to control the first buffer circuit such that any variation of the common mode output signal is removed from the differential output signal.

17. The input buffer of claim 16, wherein the detector provides the second buffer circuit with an up control signal when a level of the common mode output signal is lower than a level of the reference output signal, and wherein the detector provides the second buffer circuit with a down control signal when a level of the common mode output signal is higher than a level of the reference output signal.

18. The input buffer of claim 16, wherein the detector provides the first buffer circuit with a control signal when a level of the common mode output signal matches a level of the reference output signal.

19. The input buffer of claim 16, further comprising a plurality of first buffer circuits.

20. The input buffer of claim 19, wherein the detector simultaneously provides an up control signal and a down control signal to the second buffer circuit based on a result of the comparison.

* * * * *